United States Patent
Bungo et al.

(10) Patent No.: US 11,740,027 B2
(45) Date of Patent: Aug. 29, 2023

(54) STACKED PLATE HEAT EXCHANGER

(71) Applicant: T.RAD CO., LTD., Tokyo (JP)

(72) Inventors: Takuya Bungo, Tokyo (JP); Atsushi Okubo, Tokyo (JP); Taiji Sakai, Tokyo (JP)

(73) Assignee: T.RAD Co., Ltd., Tokyo (JP)

(*) Notice: Subject to any disclaimer, the term of this patent is extended or adjusted under 35 U.S.C. 154(b) by 155 days.

(21) Appl. No.: 17/439,150

(22) PCT Filed: Apr. 13, 2020

(86) PCT No.: PCT/JP2020/016982
§ 371 (c)(1),
(2) Date: Sep. 14, 2021

(87) PCT Pub. No.: WO2020/209390
PCT Pub. Date: Oct. 15, 2020

(65) Prior Publication Data
US 2022/0155020 A1    May 19, 2022

(30) Foreign Application Priority Data
Apr. 12, 2019    (JP) .................................. 2019-076034

(51) Int. Cl.
*H01L 23/473* (2006.01)
*H01L 21/48* (2006.01)
*F28D 9/00* (2006.01)

(52) U.S. Cl.
CPC ........ *F28D 9/0043* (2013.01); *H01L 21/4882* (2013.01); *H01L 23/473* (2013.01)

(58) Field of Classification Search
CPC ....... H01L 23/34; H01L 24/40; H01L 23/473; H01L 21/48
USPC .......................................... 165/166; 257/712
See application file for complete search history.

(56) References Cited

U.S. PATENT DOCUMENTS

| 6,986,382 | B2 | 1/2006 | Upadhya et al. | |
| 10,655,922 | B2 * | 5/2020 | Bungo | F28F 13/003 |
| 2009/0314474 | A1 * | 12/2009 | Kimbara | H01L 23/473 165/104.19 |
| 2018/0245862 | A1 * | 8/2018 | Bungo | F28F 3/086 |
| 2018/0283802 | A1 * | 10/2018 | Bungo | F28F 3/048 |
| 2019/0249934 | A1 * | 8/2019 | Bungo | H05K 7/20254 |
| 2019/0323778 | A1 * | 10/2019 | Ojiro | F28D 21/0003 |

FOREIGN PATENT DOCUMENTS

| JP | 2006-517728 A | 7/2006 |
| JP | 2014-033063 A | 2/2014 |
| WO | 2017/047825 A1 | 3/2017 |

* cited by examiner

*Primary Examiner* — Justin M Jonaitis
(74) *Attorney, Agent, or Firm* — Norris McLaughlin, P.A.

(57) ABSTRACT

To mitigate thermal stress concentration in the vicinity of a flow-volume limiting portion in a stacked plate heat exchanger to thereby prevent fatigue breaking due to the same. The flow-volume limiting portion is also provided with opening portions that are similar to those in flow paths to reduce rigidity difference from flow path portions.

3 Claims, 5 Drawing Sheets

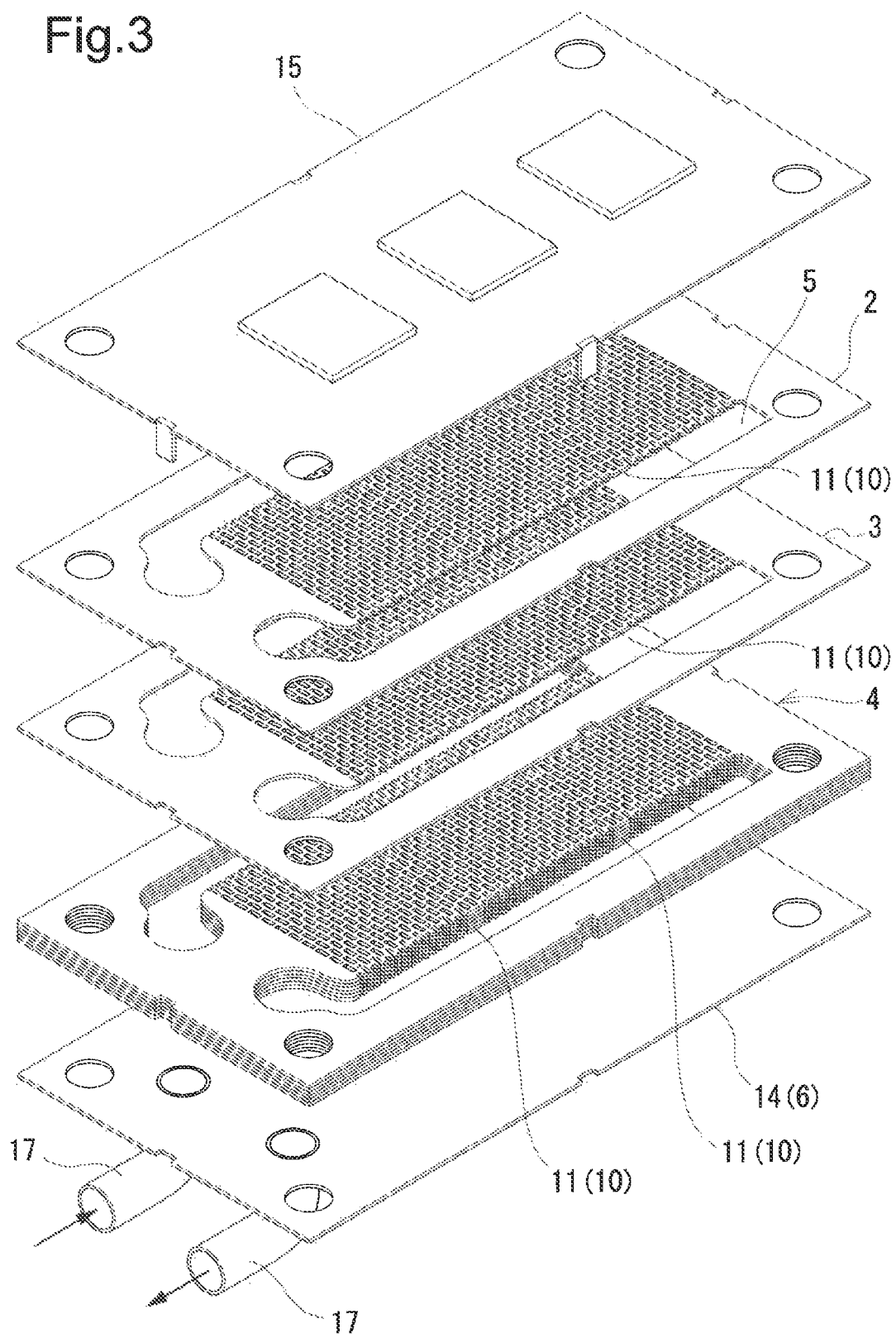

STACKED PLATE HEAT EXCHANGER

TECHNICAL FIELD

The present invention relates to a stacked plate heat exchanger that preforms heat exchange with a heat exchange object such as a semiconductor device.

BACKGROUND ART

In a stacked heatsink described in undermentioned patent literature 1, first punching plates and second punching plates, in which a number of holes are arranged in parallel, are stacked, and an outer circumference is covered with a casing. Then, heating elements such as semiconductor devices are mounted on a surface of the casing, to be cooled with a refrigerant circulating in the casing.

In an instance where plural heating elements are arranged separately from each other on the surface of the casing, in order to cool effectively respective heating elements, it is necessary to circulate the refrigerant while being concentrated there.

Accordingly, effective cooling was performed by supplying a refrigerant only to heating element portions, by not providing a hole through which a refrigerant circulated at positions where a heating element was not present.

CITATION LIST

Patent Literature

PTL 1: WO 2017/047825 A1

SUMMARY OF INVENTION

Technical Problem

However, difference is generated between rigidity of portions not having a hole for refrigerant circulation and rigidity of portions having a hole, and therefore thermal stress due to cooling/heating cycle going with use/shutoff of the heatsink may concentrate near a boundary between the portion not having the hole and the portion having the hole to generate a crack due to fatigue breaking at a brazed portion near the boundary.

Moreover, a brazing filler metal lying at the portion not having the hole may flow out to the portion having the hole to clog the hole.

Consequently, the present invention is directed to solve such problems.

Solution to Problem

The present invention according to claim 1 is a stacked plate heat exchanger, including:

a core 4 that has plural first punching plates 2 and second punching plates 3 each having a number of opening portions 1a and non-opening portions 1b drilled alternately and arranged two-dimensionally in parallel and being flat and made of a metal, and that the respective punching plates 2 and 3 are stacked alternately and the respective opening portions 1a of the respective punching plates 2 and 3 lying next to each other are displaced mutually in a planar direction; and a casing 6 that covers an outer circumference of the core 4, and that has a manifold portion 5 for a fluid circulating into the inside, in which:

these respective elements are brazed and fixed integrally, and a heat exchange object is mounted on an outer surface of the casing 6; and a number of flow paths 9 for a fluid through which the fluid circulates in a planar direction as a whole in respective opening portions 1a of the first punching plate 2 and the second punching plate 3 while meandering in a thickness direction, wherein:

the respective flow paths 9 are formed in parallel mutually from one end of the core 4 toward the other end;

in an intermediate position in a direction orthogonal to the flow path 9, a limiting portion 10 that limits circulation of the fluid exists in parallel with the adjacent flow path 9; and in the limiting portion 10, a number of the opening portions 1a and non-opening portions 1b are alternately drilled in parallel two-dimensionally in the first punching plate 2 and the second punching plate 3, and a blocking portion 11 is provided by occluding at least a part in a circulation direction of the fluid to block circulation of the fluid.

The present invention according to claim 2 is a stacked plate heat exchanger, including:

a core 4 that has plural first punching plates 2 and second punching plates 3 each having a number of opening portions 1a and non-opening portions 1b drilled alternately and arranged two-dimensionally in parallel and being flat and made of a metal, and that both punching plates 2 and 3 are stacked in contact with each other and the respective opening portions 1 of the respective punching plates 2 and 3 lying next to each other are displaced mutually in a planar direction; and a casing 6 that covers an outer circumference of the core 4, and that has a manifold portion 5 for a fluid circulating into the inside, in which:

these respective elements are brazed and fixed integrally, and a heat exchange object is mounted on an outer surface of the casing 6; and a number of flow paths 9 for a fluid through which the fluid circulates in a planar direction as a whole in the respective opening portions 1 of both punching plates 2 and 3 while meandering in a thickness direction, wherein:

the respective flow paths 9 are formed in parallel mutually from one end of the core 4 toward the other end;

in an intermediate position of the core 4 in a direction orthogonal to the flow path 9, a limiting portion 10 that limits circulation of the fluid exists in parallel with the adjacent flow path 9; and the limiting portion 10 is in parallel as a second flow path 12 for the fluid, in the same way as the adjacent flow path 9, formed with the length extended longer than a flow path length of the adjacent flow path to give an increased flow path resistance more than that of the adjacent flow path 9.

The present invention according to claim 3 is the stacked plate heat exchanger according to claim 2, wherein the second flow path 12 has an extended flow path length longer than the flow path length of the adjacent flow path 9 by turning back from one end of the core 4 toward the other end.

Advantageous Effects of Invention

In the invention according to claim 1, the limiting portion 10 that limits circulation of a fluid exists in an intermediate position in a direction orthogonal to respective flow paths 9 for the fluid in parallel to the flow path 9; and in the limiting portion 10, a number of opening portions 1a and non-opening portions 1b are alternately drilled in parallel two-dimensionally in the first punching plate 2 and the second punching plate 3, and the blocking portion 11 is provided by occluding at least a part thereof in a circulation direction of the fluid to block circulation of the fluid.

As a consequence of providing the blocking portion 11 that blocks circulation of a fluid for the limiting portion 10 in this way, it is possible to supply the fluid to other flow paths 9 needing the same to perform effective heat exchange with the heat exchange object. With this, as a consequence of providing the opening portion 1a for the limiting portion 10, rigidity difference from other portions is reduced. Therefore, generation of a crack due to a cooling/heating cycle can be prevented. Furthermore, an excessive brazing filler metal in the limiting portion 10 is absorbed into the opening portion 1a existing there, and therefore effluence of the brazing filler metal from the limiting portion 10 to the flow path 9 can be prevented.

In the invention according to claim 2, in an intermediate position of the core 4 in a direction orthogonal to respective flow paths 9, the limiting portion 10 that limits circulation of a fluid exists in parallel with the adjacent flow path 9; and the limiting portion 10 is in parallel as the second flow path 12 for the fluid, in the same way as the adjacent flow path 9, formed with the length extended longer than a flow path length of the adjacent flow path to give an increased flow path resistance more than that of the adjacent flow path 9.

As a consequence of setting flow path resistance of the limiting portion 10 increased more than that of the adjacent flow path 9 in this way, it becomes possible to supply the fluid also to the limiting portion 10 while supplying a sufficient fluid to the flow path 9. Therefore, effective heat exchange can be performed for the heat exchange object in accordance with heat distribution due to the same. With this, by setting in parallel the limiting portion 10 as the second flow path 12 for a fluid in the same way as the adjacent flow path 9, rigidity difference from other portions is reduced. Therefore, generation of a crack due to a cooling/heating cycle can be prevented. Furthermore, an excessive brazing filler metal in the limiting portion 10 is absorbed into the opening portion 1a existing there, effluence of the brazing filler metal from the limiting portion 10 to the flow path 9 can be prevented.

In the invention according to claim 3, in the above-described constitution, the second flow path 12 is turned back and extended longer than the flow path length of an adjacent flow path 9.

By configuring in this way, a second flow path that has a long flow path length and large circulation resistance can be formed easily, and allocation of the fluid to respective flow paths can be adjusted. Due to the adjustment, suitable heat exchange in accordance with magnitude of a heat generation/heat absorption volume at respective positions can be realized. In other words, for a portion with a comparatively small heat generation/heat absorption volume, comparatively small heat exchange in accordance with the same can be realized.

BRIEF DESCRIPTION OF DRAWINGS

FIG. 3 illustrates an exploded perspective view of a stacked plate heat exchanger in a second Example of the present invention.

DESCRIPTION OF EMBODIMENTS

Next, embodiments of the present invention will be explained on the basis of the drawings.

Example 1

Figure 1A:
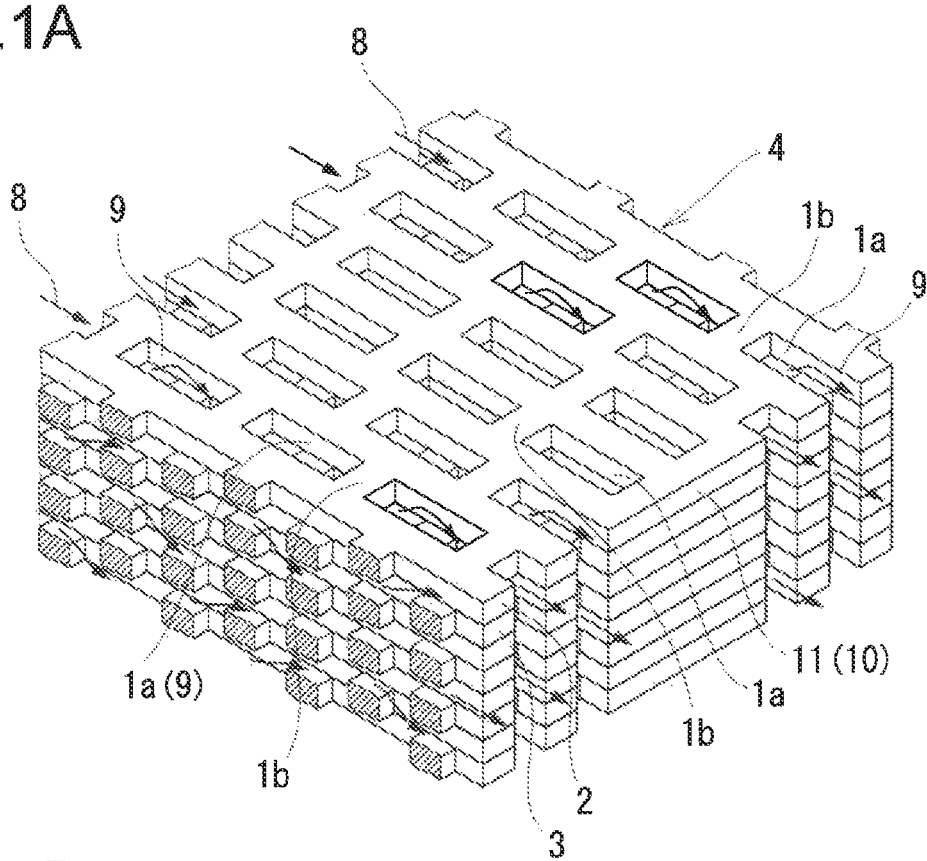
FIG. 1A illustrates a main part perspective view of a stacked plate heat exchanger of the present invention.
Figure 1B:
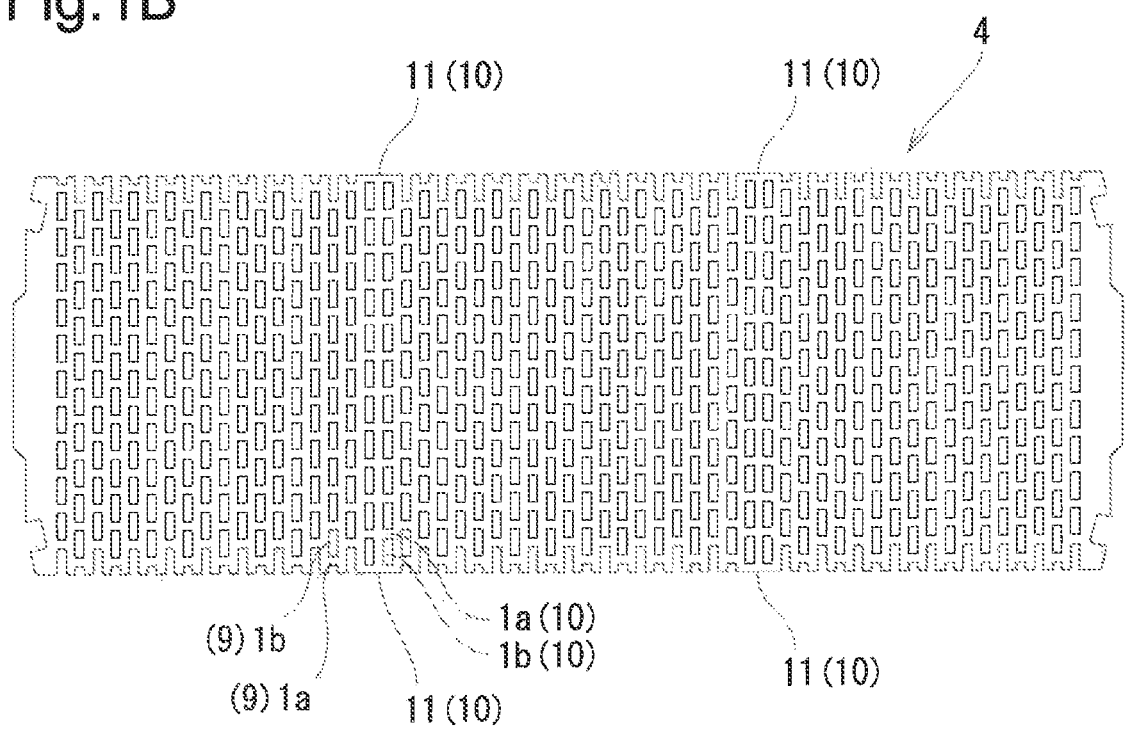
FIG. 1B illustrates a plan view of the core 4 of the heat exchanger.
Figure 2:
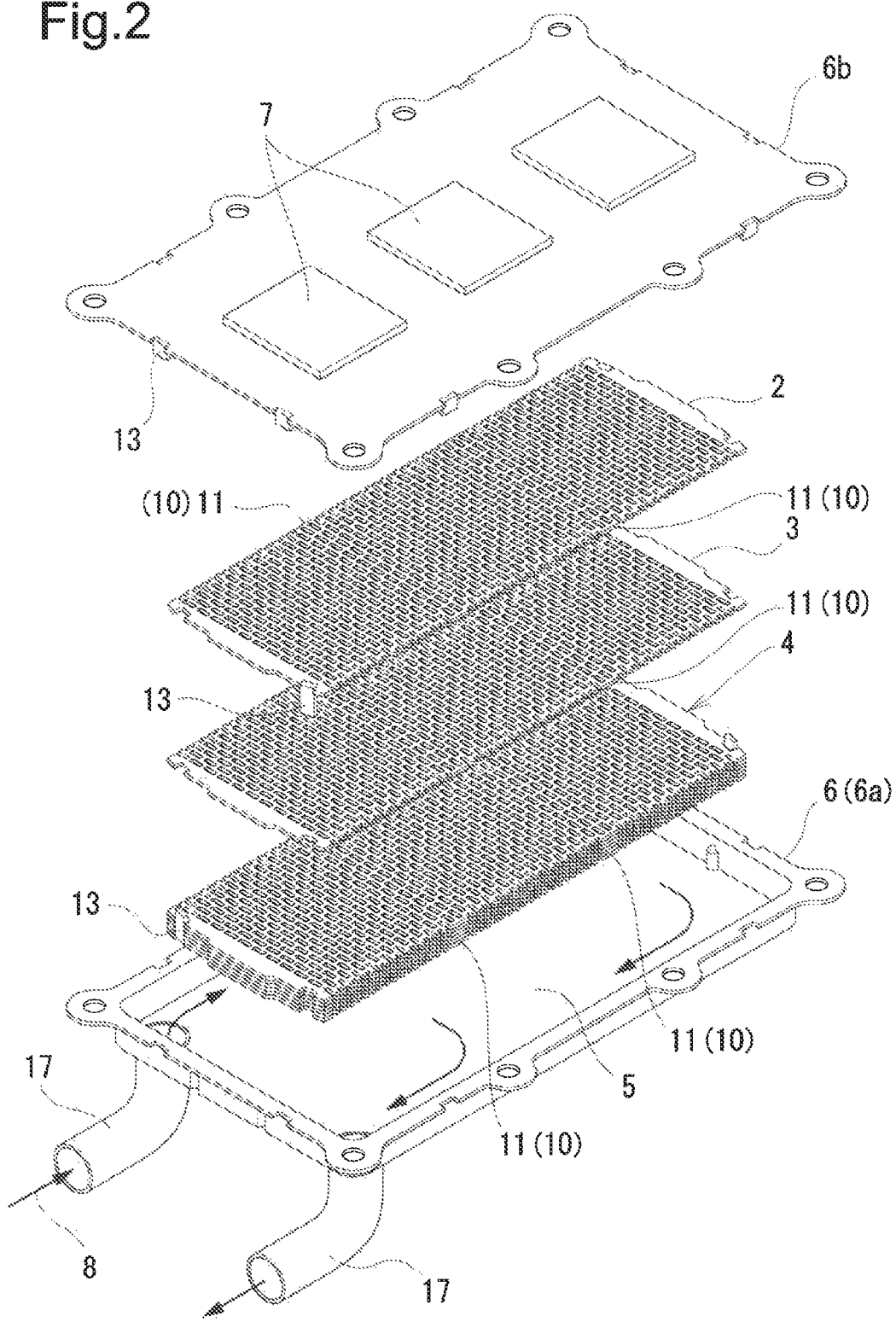
FIG. 2 illustrates an exploded perspective view of the heat exchanger.

FIGS. 1A, 1B and FIG. 2 illustrate a stacked plate heat exchanger in a first Example of the present invention, in which FIG. 1A is a main part perspective view of a core 4 thereof and 1B is an overall plan view thereof. FIG. 2 is an exploded perspective view of the Example.

In this heat exchanger, a first punching plate 2 and a second punching plate 3 with opening portions 1a lying at mutually different positions are stacked to constitute the core 4, and an outer circumference of the core 4 is covered with a casing 6. Then, a manifold portion 5 is formed inside the casing 6, respective elements are brazed and fixed integrally to configure a heat exchanger, and heating elements 7 are mounted on an outer surface of the casing 6.

In other words, the first punching plate 2 and the second punching plate 3 are made of a metal plate, in each of which a number of the opening portions 1a and non-opening portions 1b are alternately and two-dimensionally arranged in parallel. Furthermore, in the first punching plate 2 and the second punching plate 3, the opening portions 1a are displaced mutually in a planar direction. In addition, there is a flow path 9 through which a refrigerant 8 circulates in the respective opening portions 1a of the first punching plate 2 and the second punching plate 3 in a planar direction as a whole, while meandering in a thickness direction. The flow paths 9 are formed in parallel with each other from one end of the core 4 toward the other end. Furthermore, in an intermediate position in the direction orthogonal to the flow path 9, a limiting portion 10 that limits circulation of the refrigerant 8 exists in parallel with the adjacent flow path 9.

This limiting portion 10 is constituted, in the same way as the adjacent flow path 9, by drilling alternately a number of the opening portions 1a and non-opening portions 1b in the first punching plate 2 and in the second punching plate 3. With this, in this limiting portion 10, a blocking portion 11 is provided, which blocks circulation of the refrigerant 8, by occluding at least a part in a circulation direction of the refrigerant 8.

In this example, as shown in FIG. 1 and FIG. 2, the blocking portion 11 is formed at both end positions in the width direction of the respective plates, and thereby circulation of the refrigerant 8 is blocked.

Action

In FIG. 2, the casing 6 in which the core 4 is contained is composed of a casing main body 6a formed in a dish shape and an end lid 6b for occluding the opening thereof. To the casing main body 6a, a pair of pipes 17 are arranged, spaced apart from each other in the width direction. Furthermore, in an instance where the core 4 is contained in the casing main body 6a, the manifold portion 5 is formed at both ends in the width direction thereof. Then, the refrigerant 8 having flowed in from one pipe 17 circulates in the width direction of the core 4.

At this time in FIG. 1A, the refrigerant 8 circulates in a linear direction as a whole in a plane, while meandering in the vertical direction between the first punching plate 2 and the second punching plate 3 alternately stacked vertically.

In this example, the blocking portion 11 of the limiting portion 10 in FIGS. 1A and 1B is arranged in the intermediate position between plural heating elements disposed at an interval on the outer surface of the end lid 6b in FIG. 2. In this limiting portion 10, as described above, the opening portion 1a and the non-opening portion 1b are formed alternately in the same way as in other flow paths 9 lying in parallel, but both end portions thereof are occluded with the blocking portion 11. Therefore, the refrigerant 8 does not circulate into the limiting portion 10. The refrigerant 8 circulates only through respective flow paths 9 excluding the limiting portion 10. Accordingly, the refrigerant 8 is distributed to other flow paths 9 as much as a volume of the refrigerant 8 not circulating to the limiting portion 10. Consequently, the refrigerant 8 is distributed efficiently to positions in which the heating element 7 exists to accelerate heat exchanger.

With this, in positions where the limiting portion 10 exists, a number of the opening portions 1a and the non-opening portions 1b are formed, and therefore, in the position of the limiting portion 10 and in other positions, constructions thereof are approximately the same and also to give approximately the same rigidity. Therefore, when the respective first punching plates 2 and second punching plates 3 are brazed to form a heat exchanger, a partial excess of a brazing filler metal or metal clogging does not occur. With this, generation of a crack in a heat exchanger going with a cooling/heating cycle in operation does not arise in the limiting portion 10 part.

Example 2

Next, FIG. 3 illustrates a second Example of the present invention, and this Example is different from the above-described Example in shapes of the casing 6 and the core 4.

At both upper and lower planes of the core 4, a top board plate 15 and a bottom board plate 14 are included. Furthermore, between the respective plates are brazed and fixed integrally. In this example, the manifold 5 is formed integrally to the respective punching plates constituting the core 4.

The limiting portion 10 and the blocking portion 11 formed to the core 4 are the same as those in the above-described Example.

Example 3

Figure 4A:
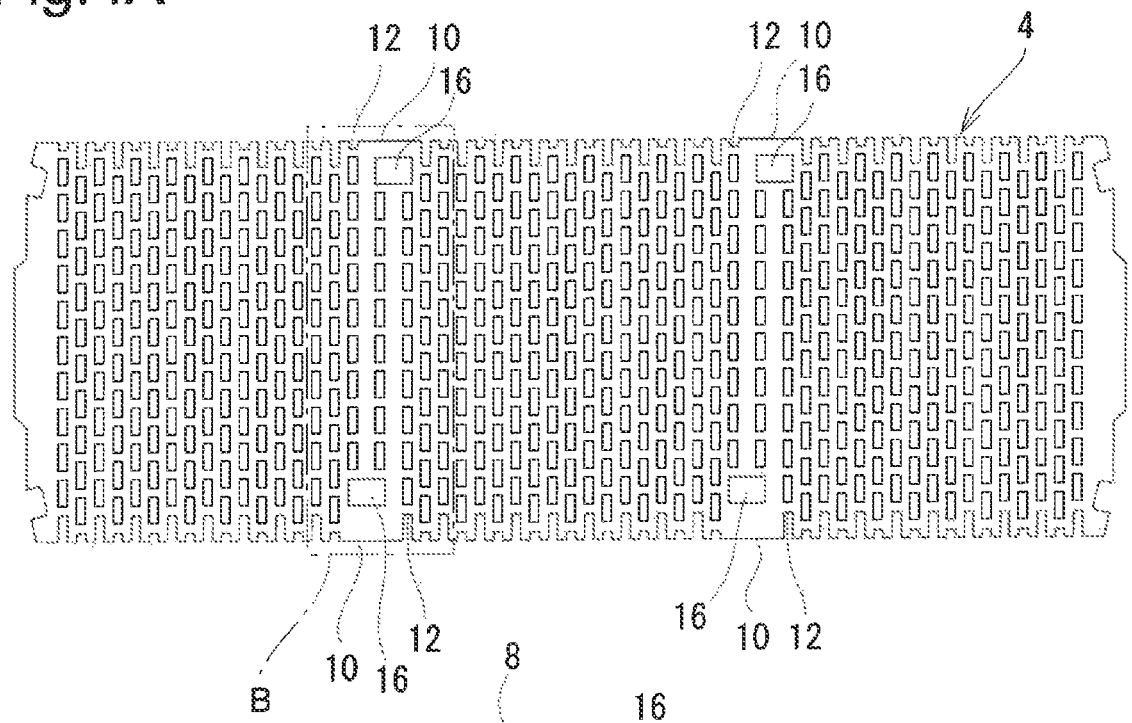
FIG. 4A illustrates a plan view of a third Example of the present invention.
Figure 4B:
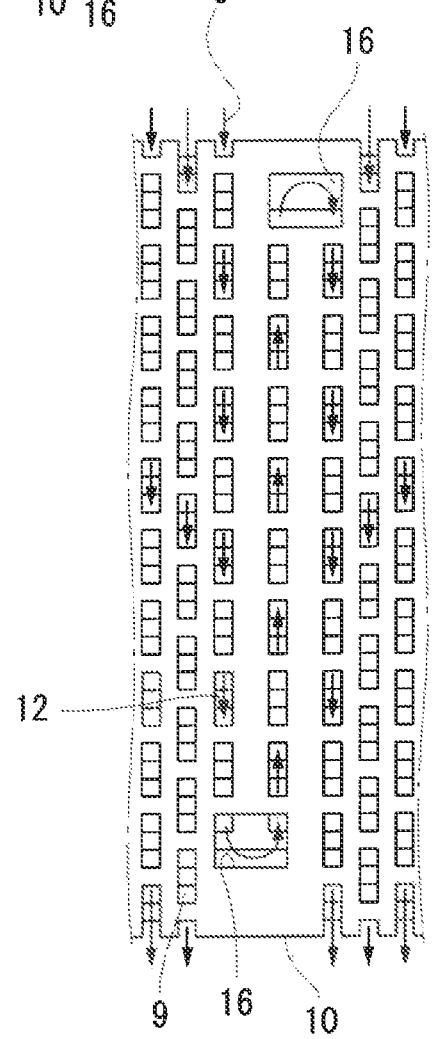
FIG. 4B illustrates a B-portion enlarged view in FIG. 4A.
Figure 5:
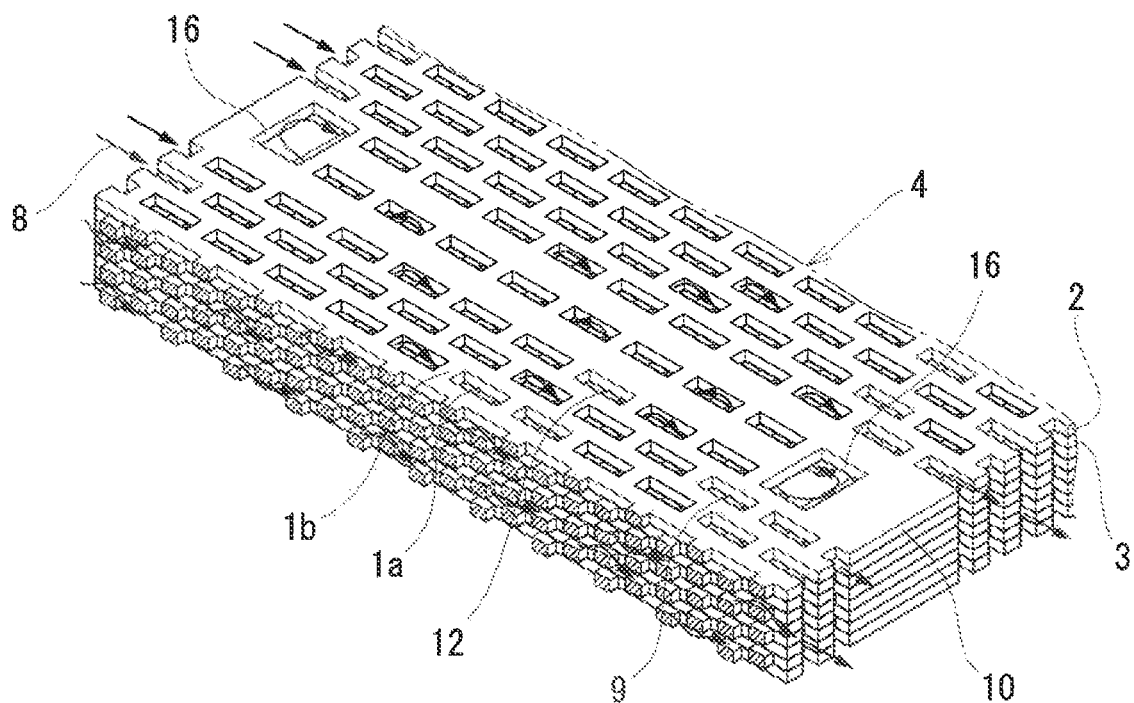
FIG. 5 illustrates a perspective view, showing an action of the third Example.

Next, FIGS. 4A and 4B illustrate a third Example of the present invention, in which FIG. 4A is a plan view of the core 4 thereof, FIG. 4B is a main part plan view and is an enlarged view of a B portion in FIG. 4A, and FIG. 5 is an explanatory view showing the action thereof.

This example is different from the example in FIGS. 1A and 1B in constructions of limiting portions 10 in both examples.

In FIGS. 1A and 1B, the blocking portion 11, in which the opening portion 1a has been occluded, exists at both ends in a circulation direction as the limiting portion 10. In contrast, in the example in FIGS. 4A and 4B, the limiting portion 10 forms the second flow path 12, into which the refrigerant 8 turns back and circulates in a horizontal direction, and the length thereof becomes longer than those of other flow paths 9 to give an increased circulation resistance. In other words, the flow path is elongated as compared with an adjacent flow path 9 for the refrigerant 8.

In this example, the second flow path 12 is arranged in an intermediate position between adjacent heating elements 7 in FIG. 2, as shown in FIGS. 4A and 4B. As to this second flow path 12, the flow path is turned back in a turning back hole 16 at both ends of the core 4 to give an elongated length.

As an example, in this example it is three times longer than those in other flow paths 9. By just that much, flow path resistance for the refrigerant 8 becomes increased. However, also in the second flow path 12, the refrigerant 8 circulates, and therefore heat exchange is accelerated also at edge portions of the adjacent heating elements 7 in FIG. 2. With this, the opening portion 1a and the non-opening portion 1b are formed respectively in the first punching plate 2, the second punching plate 3 to thereby result in an approximately same constitution as those in other parts also in the limiting portion 10, and it is possible to respond to a heat cycle. With this, clogging does not occur in brazing of the respective plates.

Other Examples

In the above-described third Example, in the limiting portion 10, the second flow path 12 is turned back in the turning back hole 16 at both ends of the core 4 to thereby give a longer length than that of the flow path 9. However, in place of turning back, it is also possible to set the length thereof longer than that of the flow path 9, by setting length of the opening portion 1a and the non-opening portion 1b in a circulation direction of the fluid shorter than the length in the instance of the flow path 9 and alternately drilling more of these, in the limiting portion 10, and allowing the second flow path 12 to meander more times in the stacking direction of the first punching plate 2 and the second punching plate 3.

The stacked plate heat exchangers in above-described Examples are for cooling heating elements (heat exchange objects) with a refrigerant (fluid), but the application is not limited to it. The plate heat exchanger of the present invention can be used for applications of heating heat exchange objects by substituting a warm/hot fluid for a refrigerant being a fluid.

Reference Signs List

1a: opening portion
1b: non-opening portion
2: first punching plate
3: second punching plate
4: core
5: manifold portion
6: casing
6a: casing main body
6b: end lid
7: heating element
8: refrigerant
9: flow path
10: limiting portion
11: blocking portion
12: second flow path
13: claw portion
14: bottom board plate 15: top board plate
16: turning back hole
17: pipe

The invention claimed is:

1. A stacked plate heat exchanger, comprising:
a core that has plural first punching plates and second punching plates each having a number of opening portions and non-opening portions drilled alternately and arranged two-dimensionally in parallel and being flat and made of a metal, and that the respective punching plates are stacked alternately and the respective opening portions of the respective punching plates lying next to each other are displaced mutually in a planar direction; and
a casing that covers an outer circumference of the core, and that has a manifold portion for a fluid circulating into the inside, in which:
these respective elements are brazed and fixed integrally, and a heat exchange object is mounted on an outer surface of the casing; and
a number of flow paths for a fluid through which the fluid circulates in a planar direction as a whole in the respective opening portions of the first punching plate and the second punching plate while meandering in a thickness direction, wherein:
the respective flow paths are formed in parallel mutually from one end of the core toward the other end;
in an intermediate position in a direction orthogonal to the flow path, a limiting portion that limits circulation of the fluid exists in parallel with the adjacent flow path; and
in the limiting portion, a number of the opening portions and the non-opening portions are alternately drilled in parallel two-dimensionally in the first punching plate and the second punching plate, and a blocking portion is provided by occluding at least a part in a circulation direction of the fluid to block circulation of the fluid.

2. A stacked plate heat exchanger, including:
a core that has plural first punching plates and second punching plates each having a number of opening portions and non-opening portions drilled alternately and arranged two-dimensionally in parallel and being flat and made of a metal, and that both punching plates are stacked in contact with each other and respective opening portions of both punching plates lying next to each other are displaced mutually in a planar direction; and
a casing that covers an outer circumference of the core, and that has a manifold portion for a fluid circulating into the inside, in which:
these respective elements are brazed and fixed integrally, and a heat exchange object is mounted on an outer surface of the casing; and
a number of flow paths for a fluid through which the fluid circulates in a planar direction as a whole in the respective opening portions of both punching plates while meandering in a thickness direction, wherein:
the respective flow paths are formed in parallel mutually from one end of the core toward the other end;
in an intermediate position of the core in a direction orthogonal to the flow path, a limiting portion that limits circulation of the fluid exists in parallel with the adjacent flow path; and
the limiting portion is in parallel as a second flow path for the fluid, in the same way as the adjacent flow path, formed with the length extended longer than a flow path length of the adjacent flow path to give an increased flow path resistance more than that of the adjacent flow path.

3. The stacked plate heat exchanger according to claim 2, wherein the second flow path has an extended flow path length longer than the flow path length of the adjacent flow path by turning back from one end of the core toward the other end.

* * * * *